US011029353B2

United States Patent
Shumaker et al.

(10) Patent No.: US 11,029,353 B2
(45) Date of Patent: Jun. 8, 2021

(54) CAPTURE OF TIME VARYING ELECTRIC FIELD THROUGH SYNCHRONIZED SPATIAL ARRAY OF FIELD EFFECT TRANSISTORS

(71) Applicant: U.S. Army Research Laboratory, Adelphi, MD (US)

(72) Inventors: Justin L. Shumaker, Aberdeen, MD (US); Geoffrey A. Slipher, Churchville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 302 days.

(21) Appl. No.: 16/104,993

(22) Filed: Aug. 20, 2018

(65) Prior Publication Data
US 2020/0057101 A1 Feb. 20, 2020

(51) Int. Cl.
*G01R 29/08* (2006.01)
*G01R 19/00* (2006.01)

(52) U.S. Cl.
CPC .............. *G01R 29/0878* (2013.01)

(58) Field of Classification Search
CPC ........ G01R 29/08; G01R 31/02; G01R 19/00; G01R 29/00
See application file for complete search history.

(56) References Cited

U.S. PATENT DOCUMENTS

| 5,844,415 | A | 12/1998 | Gershenfeld et al. |
| 9,829,524 | B2 | 11/2017 | Ghionea et al. |
| 9,880,120 | B2 | 1/2018 | Ghionea et al. |
| 2006/0261818 | A1* | 11/2006 | Zank ................ G08B 15/001 324/457 |
| 2010/0253319 | A1* | 10/2010 | Cehelnik ............ G06F 3/017 324/72 |

* cited by examiner

*Primary Examiner* — Neel D Shah
(74) *Attorney, Agent, or Firm* — Eric B. Compton

(57) ABSTRACT

Sensing a time varying electric field includes a device or system including a spatial sensor array having one or more transistors, a circuit including a resistor connected to each of the transistors, an analog-to-digital converter (ADC) to each circuit which convert an analog voltage outputs to digital form, and an antenna to each of the transistors. The antennas sense the time varying electric field and modulate current through their respective transistors. The spatial sensor array may be stationary or in motion during the sensing.

20 Claims, 4 Drawing Sheets

CAPTURE OF TIME VARYING ELECTRIC FIELD THROUGH SYNCHRONIZED SPATIAL ARRAY OF FIELD EFFECT TRANSISTORS

GOVERNMENT INTEREST

The embodiments described herein may be manufactured, used, and/or licensed by or for the United States Government without the payment of royalties thereon.

BACKGROUND

Technical Field

The embodiments herein generally relate to the recording or sensing of time varying electric fields, and more particularly to passive recording or sensing of a time varying electric field using field effect transistors.

Description of the Related Art

Conventional technologies employ point sources for measurement of electric fields, which are utilized in electric field sensors. Calibration techniques may vary depending on the type of sensor and the purpose of detection. Furthermore, the electric field capture rate is generally limited due to limitations in the distance of the detection, among other factors.

SUMMARY

In view of the foregoing, an embodiment herein provides a method for sensing a time varying electric field, the method comprising: providing a spatial sensor array including one or more transistors with an antenna connected to each transistor; sensing a time varying electric field with the antenna; modulating current through the one or more transistors, each of the one or more transistors connected to a respective circuit that includes a resistor, and converting the analog voltage output of each of the circuits to digital form, wherein the spatial sensor array is stationary or in motion during the sensing. The one or more transistors may comprise a junction gate field effect transistor (JFET) or a metal-oxide semiconductor field effect transistor (MOSFET). The dynamic range of sensing may range over size orders of magnitude, from $10^2$ to $10^8$ V/m, for instance. To adjust the sensitivity to electric fields, one or more of the following may be changed: the length of the antenna, operating characteristics of the one or more transistors, and/or the selection of an analog digital converter (ADC) also connected to each circuit.

Another embodiment provides a device for sensing a time varying electric field, the device comprising a spatial sensor array comprising one or more transistors; a resistor connected to each of the one or more transistors; an analog-to-digital converter (ADC) connected to each resistor; and an antenna connected to each of the one or more transistors. Each antenna senses the time varying electric field and modulate current through the transistor it is connected to. More, the spatial sensor array is to be stationary or in motion during the sensing. The one or more transistors may include a junction gate field effect transistor (JFET) or a metal-oxide semiconductor field effect transistor (MOSFET). The dynamic range of the device for sensing electric fields may range over six orders of magnitude, form $10^2$ V/m to $10^8$ V/m, for instance. The sensitivity of the device for sensing electric fields can be adjusted by changing one or more following: the length of the antenna, operating characteristics of the one or more transistors, and/or the selection of the ADC(s). In various implementations, (i) the source of each transistor is connected to a voltage source and the drain of each transistor is connected to a resistor which is also connected to ground; or (ii) the source of each transistor is connected to ground and the drain of each transistor is connected to a resistor which is also connected to a voltage source. The spatial array may take on different configurations. For example, the spatial array may be: (i) a single antenna connected to single transistor; (ii) a plurality of antennas arranged in a one dimensional (1D) spatial array, with each of the antennas connected to a single transistor; or (iii) a plurality of antennas arranged in a two dimensional (2D) spatial array, with each of the antennas connected to a single transistor. In the device, each antenna may form an individual pixel of the device.

Another embodiment provides a system for sensing a time varying electric field, the system comprising a spatial sensor array comprising a plurality of field effect transistors (FETs); a resistor connected to each of the plurality of FETs; and an analog-to-digital converter (ADC) connected to each of the resistors; an antenna connected to each of the plurality of FETs, wherein the antenna is to sense the time varying electric field and modulate current through the plurality of FETs, wherein the spatial sensor array is to be stationary or in motion during the sensing; and a computer processor to receive and process signals from the sensed time varying electric field. The plurality of FETs may comprise a junction gate field effect transistor (JFET) or a metal-oxide semiconductor field effect transistor (MOSFET). The dynamic range of the system for sensing electric fields may range over six orders of magnitude, from $10^2$ V/m to $10^8$ V/m, for instance. The sensitivity of the system for sensing electric fields may be adjusted by changing one or more following: the length of the antenna, operating characteristics of the one or more FETs, and/or the selection of the ADCs. The system may further comprise a memory which stores digital output of the ADCs for a given time sequence.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1A:
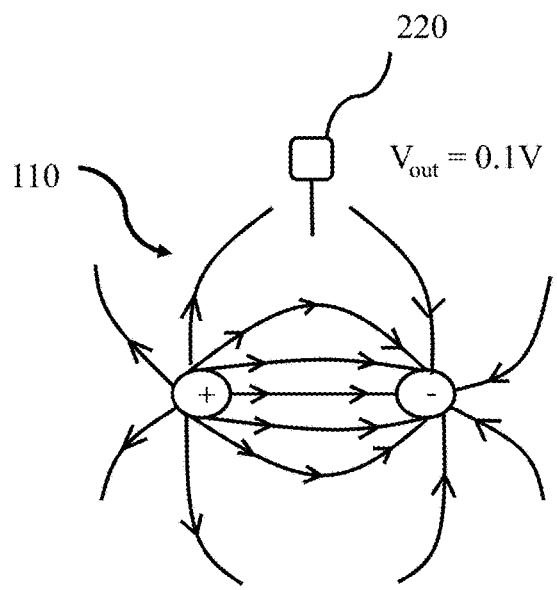
FIG. 1A is a schematic diagram of sensor adjacent to an electric field according to an embodiment.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a method for recording a time varying electric field using a spatial array of transistor(s) in which all of the sensors are synchronized for each detection of the electric field to be captured. Technology related to the long-distance detection or sensing of electric fields (that is, electric field telescopes) is desirable. Additionally, high speed industrial production monitoring such as monitoring to detect flaws in various products (e.g., the detection of flaws in capacitor grade film lines), and the detection or diagnosis of electronic failure in stretchable electronic components related to dielectric breakdown arising from electromechanical instabilities, may require high-speed, high dynamic range, and non-contact visualization of an electric field.

To do this, it may be desirable to use an electric field detection device/system that is completely passive, that is, an electric field detection device/system that does not emit any electromagnetic energy or beams such as infrared or laser beams.

To that extent, the exemplary embodiments herein provide a device, system and method for the remote, high speed, and high dynamic range detection of electric fields. Accordingly, the exemplary embodiments provide a passive antenna for detecting an electric field or changes in an electric field in a location remote from the antenna. In an example, the antenna may be configured as an encapsulated wire antenna, and the length of the wire may be selected according to the desired range of the antenna. Referring now to the drawings, and more particularly to FIGS. 1A through 7, where similar reference characters denote corresponding features consistently throughout the figures, there are shown exemplary embodiments for detecting electric fields.

Figure 1B:
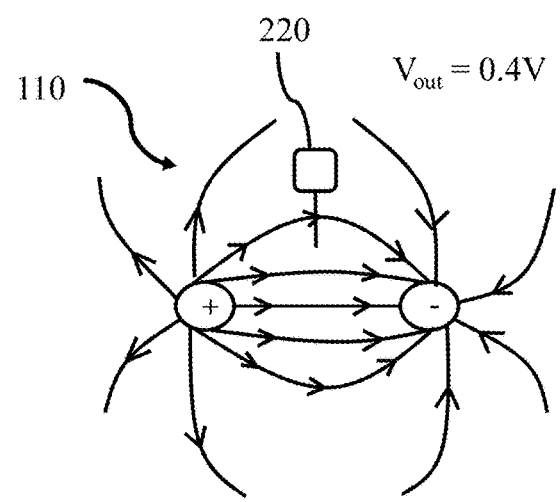
FIG. 1B is a schematic diagram of sensor entering an electric field according to an embodiment.

Referring to FIGS. 1A and 1B, an electrical field 110 is provided. The electric field 110 comprises a force field that surrounds positive and negative electric charges that attract or repel other positive or negative electric charges. The electric field 110 may be created by electric charges and by time-varying magnetic fields, such as electrodynamic fields. It is assumed to extend an infinite distance. A single sensor element 220 is shown adjacent to the electric field 110 represented by lines of equipotential (FIG. 1A). As the sensor element 220 is moved into the electric field 110 (FIG. 1B) and encounters higher potentials the sensor analog voltage output ($V_{out}$) increases as a function of the increased potential measured. The notional values of the voltage output are shown as examples.

Figure 2A:
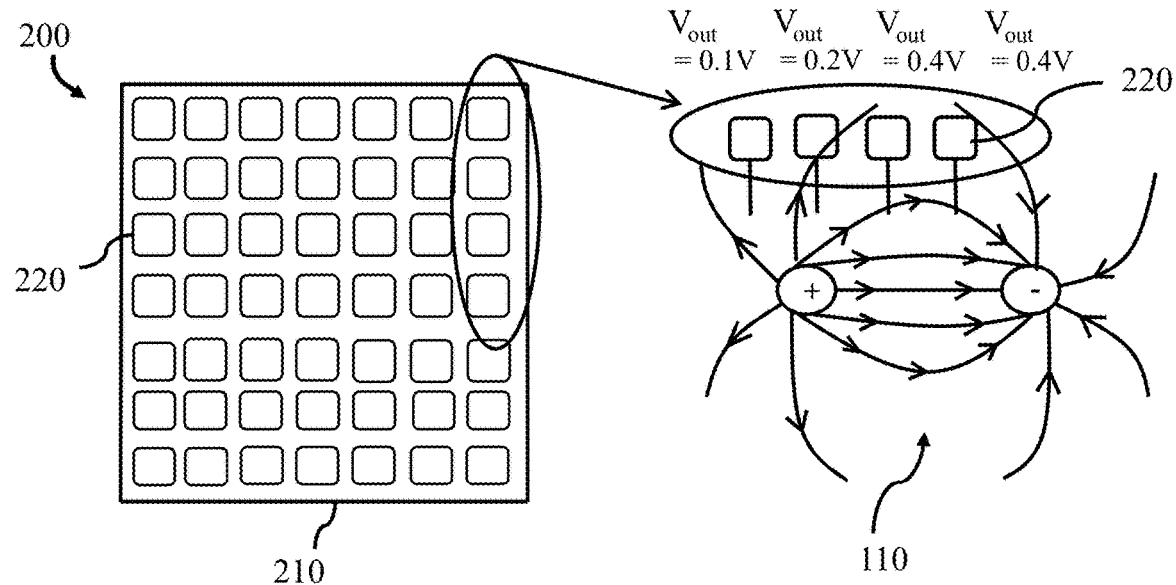
FIG. 2A is a schematic illustration of an electric field detection system according to an embodiment.
Figure 2B:
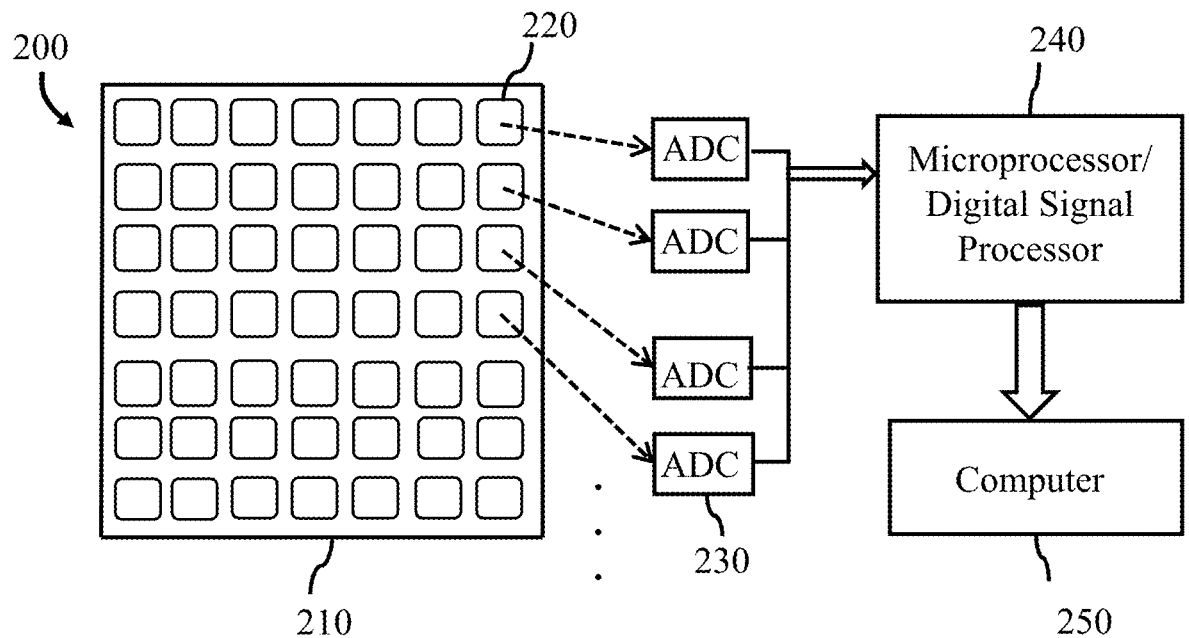
FIG. 2B is a schematic illustration of a spatial array of sensing elements according to another embodiment.

Turning now to FIGS. 2A and 2B, and with reference to FIGS. 1A and 1B, an electric field detection system 200 according to an embodiment is illustrated. The electric field detection system 200 includes a printed circuit board (PCB) populated with an array 210 of sensor elements 220. In an example, the sensor elements 220 each comprise a transistor 520 (of the circuit 500 shown in FIG. 5A or the circuit 500' shown in FIG. 5B). The transistor 520 may include field effect transistors (FETs), junction gate FETs (JFET) transistors, or metal-oxide semiconductor FET (MOSFET) transistors, according to various examples. The transistors 520 in the system would be of the same type, according to an example. Each of the transistors 520 may represent a single pixel of the PCB containing the sensor array 210, according to an example.

Figure 5A:
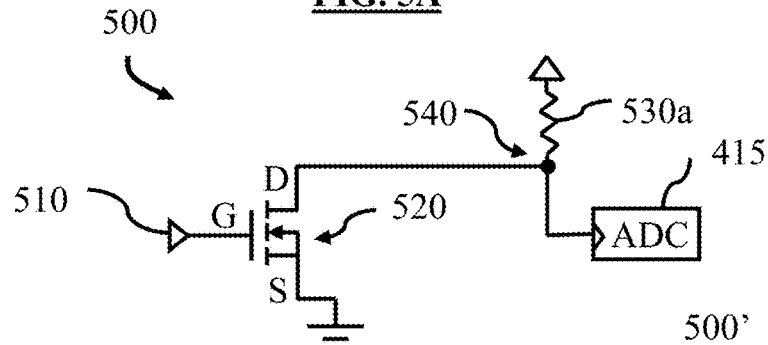
FIG. 5A is a schematic illustration of a single electric field sensor circuit with an antenna.
Figure 5B:
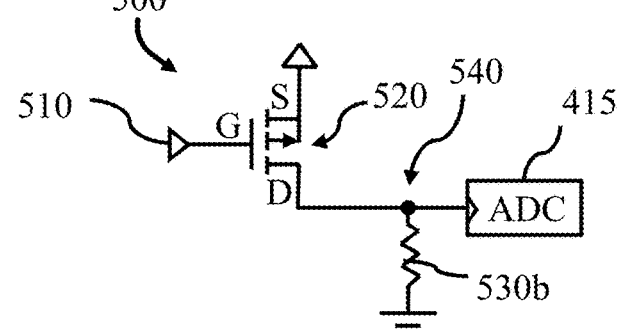
FIG. 5B shows an alternative circuit thereof, according to embodiments.

More particularly, FIGS. 2A and 2B illustrate a 7×7 array 210 of sensor elements 220, with each sensor element 220 comprising a transistor 520 and a resistor 530 (shown in FIG. 5A and FIG. 5B). Although a 7×7 array 210 of sensor elements 220 is illustrated, this is only exemplary, and any sized PCB array may be implemented. A uniform x-y spacing of 5 mm between adjacent sensor elements 220 may be employed, for instance. Each sensor element 220 may be connected to an input of an analog-to-digital converter (ADC) 230. The digitized data from the ADC 230 is transmitted to a microprocessor (or digital signal processor) 240, where filtering and other digital signal processing may take place at a user-specified sampling rate. The processed data may then be transported via Ethernet packets to a networked computer 250 for visualization and further data processing.

The computer 250 may utilize the received data for both qualitative and quantitative purposes. For example, when configuring a specimen (not shown) for various measurements, a test signal may be generated, and visualization software may be used to confirm that the sensor element 220 is working and is located at an appropriate distance from the specimen. Periodically, the sensor element 220 may be calibrated in which the data from each sensor element 220 in the sensor array 210 is evaluated against a ground truth to calculate its calibration value. When a specimen is measured with a calibrated sensor array 210, the data can then be analyzed and used to locate and measure the electric field 110 at spatial intervals over the surface of the specimen.

In FIG. 2A, the encircled subset view of the 2D sensor array 210 is shown immersed in an electric field 110. This shows a how the sensor array 210 becomes immersed in the electric field 110 represented by lines of equipotential to provide an output to the ADC 230 (of FIG. 2B) proportional to the potential measured at each location of the sensor elements 220. The notional voltage outputs ($V_{out}$) for each sensor element 220 shown are examples.

As shown in FIG. 2B, each sensor element 220 has its analog output mapped to an analog-to-digital converter ADC 230 (a subsection of four ADCs 230 are shown, for example). The spatial array 210 of sensor elements 220 are arranged with known orientations. The spatial array 210 in the presence of an electric field 110 is measured by each sensor element 220 at their respective locations, each producing a voltage corresponding to the electric field magnitude. The following example illustrates one possible instantiation. Each ADC 230 may have an independent connection with the microprocessor 240 or each ADC 230 may share a communications bus and have a unique address. When the computer 250 requests a frame, the array of ADC sensors elements 220 simultaneously captures the magnitude of the electric field 110 at a point in time. These states, which may be referred to as values, are stored in the ADC 230 until they are read. After the frame has been captured, the computer 250 may request the data associated with the captured frame. The data is then transmitted to the computer 250. The data is organized in the order of first ADC to last ADC. The software application on the host computer 250 may choose to generate an image for visualization purposes by mapping each pixel to the computer screen that correlates with the absolute location of each sensor in the spatial array. The intensity of each pixel is a function of the ADC value.

Although discrete MOSFET and JFET transistors are discussed herein, the use of MOSFET and JFET transistors is only exemplary, and other FET types such as Metal-Semiconductor Field Effect Transistors may be implemented and used in accordance with the embodiments herein. The principle difference between MOSFETs and JFETs in the exemplary embodiments is that a MOSFET makes a non-transient field measurement possible, while a JFET requires a transient electric field to be present. The response of the JFET may be between 0.1 Hz and 50 kHz, in an example.

The spatial array 435 of sensors 437 (shown in FIG. 4) may have an antenna 510 connected to the gate of each transistor 520, and a resistor 530 may also be connected to each of the transistors 520. As a time-varying electric field 110 reaches a minimum electric field sensitivity threshold, the antenna 510 may modulate current through the transistors 520. A voltage potential may be measured at each pixel location, and a two-dimensional (2D) x-y field may be calculated from a measured gradient across an aperture of the sensor based on the following formula:

$$E = -i\frac{\partial V}{\partial x} - j\frac{\partial V}{\partial y} - k\frac{\partial V}{\partial z} = -\left[i\frac{\partial}{\partial x} + j\frac{\partial}{\partial y} + k\frac{\partial}{\partial z}\right]V = -\nabla V.$$

The derivative with respect to the z-axis may be neglected when the 2D field is calculated. The calculation may be accomplished by a processor 335 using computer readable instructions that may be input into a non-transitory medium 340 (shown in FIG. 3).

Figure 3:
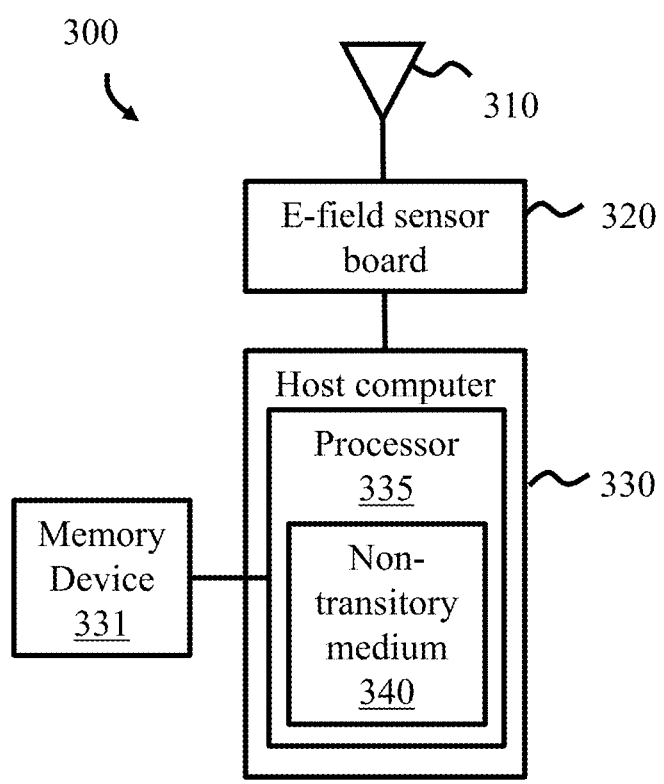
FIG. 3 is another illustration of an electric field detection system according to an embodiment.
Figure 4:
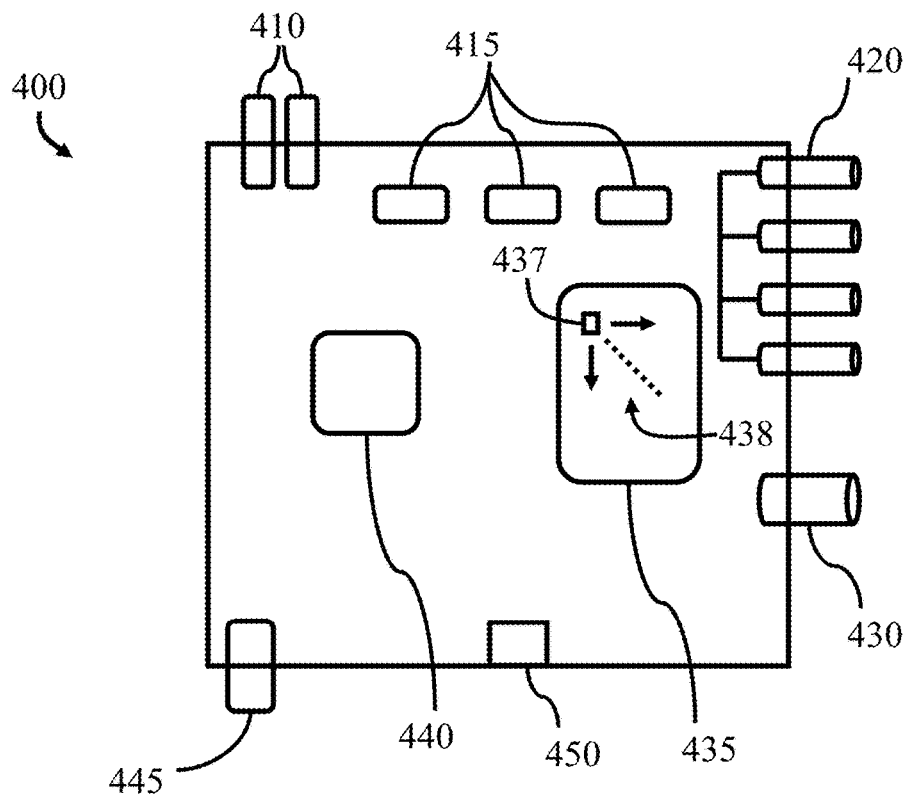
FIG. 4 is a schematic illustration of a sensor board according to an embodiment.

In FIG. 3, with reference to FIGS. 1A through 2B, an electric field detection system 300 according to an embodiment is illustrated. The electric field detection system 300 includes an antenna 310, an electric field (e-field) sensor board 320, and a host computer 330. In an example, the antenna 310 may be configured as an encapsulated wire, the length of which may be chosen based on the application desired by the user. For example, the chosen length of the antenna 310 may be used to control the minimum threshold sensitivity level of the electric field 110 (of FIGS. 1A through 2A) and the dynamic range of the antenna 310. The selective control of the minimum threshold sensitivity level and the dynamic range of the antenna 310 may be achieved independent of the physical characteristics of the transistors 520. In this example, the minimum threshold sensitivity level refers to the gate source threshold ($V_{th}$) of a transistor 520 and is defined as the minimum voltage that when applied to the gate terminal of the transistor 520 (relative to the source terminal) permits the flow of current between the drain and source terminals. Due to capacitive coupling there is a transfer of electrical energy between two nodes, a source and a detector, by means of a displacement current induced by a time varying electric field source. According to an exemplary embodiment, the length of the antenna 310 may be 1 cm, for instance. However, the length of the antenna 310 is not limited to this value.

The host computer 330 may process the signals received by the electric field sensor board 320. Furthermore, the host computer 330 may comprise the processor 335 for measuring the 2D x-y field described above, as well as the non-transitory medium 340. The processing that takes place on the host computer 330 is specific to the application. For example, the host computer 330 receives unfiltered sensor data from the processor 335. Thereafter, the processor 335 gathers data from the ADC 230, packages a 2D array of sensor data into a computer-readable frame, and then transports this data to the host computer 330 through a communication connection such as an Ethernet or USB, or to a memory device 331 that is operatively connected to the processor 335. Calibration is performed on the host computer 330 and all calibration parameters may be stored in the non-transitory medium 340 on the host computer 330.

Various examples described herein may include both hardware and software elements. The examples that are implemented in software may include firmware, resident software, microcode, etc. Other examples may include a computer program product configured to include a pre-configured set of instructions, which when performed, may result in actions as stated in conjunction with the methods described above. In an example, the preconfigured set of instructions may be stored on the tangible non-transitory computer readable medium 340 or a program storage device containing software code. In the software embodiments, instructions may be provided to the host computer 330 by the processor 335 linked to the host computer 330.

The processing techniques may be implemented as one or more software modules in a set of logic instructions stored in a machine or computer-readable storage medium 340 such as random-access memory (RAM), read only memory (ROM), programmable ROM (PROM), firmware, flash memory, etc. in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. For example, computer program code to carry out processing operations performed by the processor 335 may be written in any combination of one or more programming languages.

In an embodiment, the software modules are responsible for sampling data and either streaming it to the host computer 330 or saving it on local storage, such as memory device 340. An external trigger signal or command from the host computer 330 causes the embedded software modules to begin recording at a user-defined sampling rate for either a defined number of samples or until another trigger signal occurs. During this phase, the embedded software modules are communicating with the ADC 230 by instructing the ADC 230 to sample the sensors 437 and return the result to the non-transitory medium 340 on the embedded processor 335. The data may be sent to local storage (e.g., memory device 331) or sent via Ethernet or USB communication links to the host computer 330 using embedded software drivers that communicate with the Ethernet or USB hardware respectively. This occurs repeatedly at the user-defined sample rate.

Turning again to FIG. 4, with reference to FIGS. 1A through 3, an electric field sensor board 400 is illustrated. The sensor board 400 may include a 2D pixel array 435. The 2D pixel array 435 may include a plurality of sensors 437 arranged in a 7×7 2D planar grid 438. However, the number of pixels is not limited thereto. The 2D embodiment may assume any resolution provided there are sufficient analog to digital channels to capture the sensor data. Therefore, the single pixel and 1-D linear array embodiments are merely subsets of a 2-D arrangement. There is no limitation on the resolution of the device, although, in general, the greater the number of sensors in the array the greater then device resolution. Moreover, the pixel array 435 may be instantiated as an array of discrete components or it may be constructed at the chip level as an Application Specific Integrated Circuit (ASIC) using Very Large Scale Integration (VLSI) design methods. At the chip level, the number of sensors 437 could measure in the millions.

The electric field sensor board 400 may be powered by a Universal Serial Bus (USB) 445, but is not limited thereto. Additionally, communication to and from the electric field sensor board 400 and the host computer 330 (of FIG. 3) may be executed over the Ethernet connector 410 using a standard such as the IEEE 802.3 standard, for example. The electric field sensor board 400 may further include one or more analog-to-digital converters (ADCs) 415, a microprocessor 440, an external trigger 430, external data capture inputs 420 for synchronization, and a memory card 450 for data storage. The external trigger 430 may be used to time synchronize and/or initiate the data acquisition and data storage on the field sensor board 400 as a function of an external event or series of events that initiate the triggering mechanism. The external event can be anything that can be detected by external hardware and converted into a voltage step as the input to the field sensor board 400. For example, the external trigger 430 may be used to limit data recording to the immediate temporal neighborhood of the transient electric field event of interest. The function of how the external trigger input is interpreted can be defined in embedded firmware run by the microprocessor 440 and may be user-selectable through a user interface (not shown) or other user input devices.

Turning now to FIG. 5A, with reference to FIGS. 1A through 4, a single electric field sensor circuit 500 according to an embodiment is illustrated. The electric field detection sensor circuit 500 includes an antenna 510, ADC 415, resistor 530, and transistor 520. In the sensor 200 in which there are multiple sensors 220 arranged in a 2D spatial array (as depicted in FIGS. 2A and 2B), each sensor 220 of the sensor array 210 would be configured as the electric field sensor circuit 500 and thus may include an antenna 510, an ADC 415, a transistor 520, and a resistor 530. When the sensor array 210 is in the presence of an electric field 110, each sensor element (e.g., sensor element 220 of FIG. 2B) measures the electric field 110 at their respective locations, each producing a voltage 540 corresponding to the electric field magnitude. Each ADC 415 measures this voltage 540 and translates the voltage into a digital value. The microprocessor 440 (of FIG. 4) reads the digital value from each ADC 415 and stores its value in memory 431 (of FIG. 6). A frame 432 (of FIG. 6) is the collection of all ADC sensor data. The order of the data corresponds to the physical layout of all ADC sensors in the spatial sensor array 210.

According to an exemplary embodiment, the spatial sensor array 210 may initially be calibrated using a known electric field 110. The calibration procedure may have the following features: (1) a theoretically known electric field 110 that is presented to an aperture (not shown) of the sensor element 220; (2) an initial 'image' that is taken with the sensor aperture of a known electric field 110; and (3) a calibration matrix which is assembled from the difference between the theoretically known field strength distribution and the measured field strength at each pixel. The calibration matrix is derived, and then applied to subsequent 'images' taken with the sensor element 220 so as to correct for any inherent bias at any one pixel. Simple fields 110 may be used as the theoretically known field source, such as a point source voltage potential, line source voltage potential, or dipole. An uncalibrated visualization of a line source voltage potential may be presented diagonally across the sensor aperture (not shown), and is compared to the idealized field measurement and physical source orientation.

The antenna 510 may be adjusted in order to control the minimum sensitivity threshold of the electric field 110 and the dynamic range of the antenna 510. The electric field 110 may be recorded or detected synchronously by the sensor array 210 at arbitrarily high speeds, for example, speeds of up to 50 kHz and may be utilized in both stationary and moving applications. All pixels (e.g., sensors 437) in each frame may be captured synchronously at 50 kHz, according to an example. This differs from conventional devices where the capture device contains one to several sensors in motion, and the capture rate is substantially lower than 50 kHz. Higher speeds are feasible, and this rate is a function, in part, of the number of sensor 437 used, whereby the number of sensors 437 and the corresponding capture rate are defined as the data bandwidth of the sensor array 210. The data bandwidth may be scaled higher by increasing the processing and communication speeds.

The electric field detection sensor circuit 500 is a non-contact electric field detection system. Specifically, the electric field detection sensor circuit 500 may remotely detect the electric field 110 or may remotely and passively detect the disturbance of the electric field 110. The electric field detection sensor circuit 500 may have a high dynamic range in order to detect large electric field anomalies arising from electromechanical instabilities. The high dynamic range, for example, six orders of magnitude (e.g., $10^2$ V/m to $10^8$ V/m), may be adjusted to lower or higher field strengths, which allows the electric field detection sensor circuit 500 to be used in a wide variety of sensor applications in which high speed visualization of electric fields is desired.

For example, the electric field detection sensor circuit 500 may be used to sense the movement of individuals in indoor or outdoor spaces without active interrogation of the space, that is, without emitting detectable radio frequencies. The electric field detection sensor circuit 500 may also be used for real-time quality assurance in precise materials processing (e.g., flaw detection in capacitor grade film production), improved feedback with regard to electromechanical device performance and failures for optimization purposes (e.g., in the design of electric motors), security monitoring (e.g., as an alarm system component), and as a basic research tool in biological systems, physics, electro-chemistry (e.g., in the better understanding of permeable membrane failures in batteries), material science and engineering.

According to an example, remote sensing by the antenna 510 may occur as follows: The gate G of the transistor 520, which may be a field effect transistor, is electrically isolated from the source S and drain D of the transistor 520. Therefore, the gate G functions as a capacitor, but typically has a small associated leakage current. The transistor 520 and its corresponding components may be wired to a PCB using typical electronic wiring techniques and/or patterned using standard lithography techniques readily employed in modern electronics manufacture. The operational voltage of the transistor 520 may vary based on specific application, for example. The electric field in proximity to the gate G of the transistor 520 induces a charge thereby changing the voltage of the gate G. Since the transistor 520 is effectively a non-linear voltage-controlled resistor, the changing voltage on the gate G modulates the resistance and thereby the conductance of the device.

The resistor 530 that is connected to the transistor 520 functions as a voltage divider whereby a fixed resistor 530 is in series with a dynamic resistor (e.g., transistor 520) in which the voltage measured at the drain D of the transistor 520 correlates to the voltage of the gate G, which in turn is a measure of the strength of the electric field (e.g., electric field 110) and its induced effect to the gate G of the transistor 520. The fixed resistor 530 is configured to function as either a pull-up or pull-down mechanism since the transistor 520 has an open drain D. In other words, when the transistor 520 is completely "off", meaning it is in a non-conducting state, the drain D could be any voltage since there is no current in this state. In the circuit shown in FIG. 5A, the fixed resistor 530a functions as a fixed pull-up resistor to ensure that the drain D of the transistor 520 does not produce an erratic signal when "off". The pull-up resistor 530a would likely be used with an enhancement mode N-MOS transistor.

On the other hand, if the transistor drain D were connected the voltage source instead, as shown in alternative circuit 500' of FIG. 5B, than a pull-down resistor 530b would be used on the other side to ensure that the drain D of the transistor 520 does not produce an erratic signal when "off". The alternative arrangement would likely be used with an enhancement mode P-MOS transistor. Therefore, the pull-up and pull-down fixed resistors 530a, 530b tend to be very large in value, on the order of 1 k to 1 M ohm to satisfy this issue.

The voltage is translated into a digital or numerical value via the ADC 415 and read by the microprocessor 440. The ADC 415 can embody any of the many circuit architectures capable of accomplishing this task; e.g. sigma-delta ($\Sigma$A), successive-approximation (SAR), etc. In modern electronics, ADC are integrated circuits which many be composed of multiple ADCs. The particular ADC employed dictates the measuring sensitivity of the analog voltage input and the digital output. For instance, an 8-bit ADC has 256 ($2^8$) discrete levels, a 10-bit ADC has 1,024 ($2^{10}$) discrete levels, and a 16-bit ADC has 65,536 levels ($2^{16}$). The digital output may be given by: the number of ADC levels×analog voltage sensed/system voltage. This correlation may later be used for converting digital values to analog values, such that the analog voltage is given by: digital value/the number of digital levels× system voltage. The digital values can be stored in the memory device 331.

The antenna 510 that is operatively connected to the gate G of the transistor 520 in proximity to an electric field (e.g., electric field 110) controls induced charging upon the gate G. Currents, the result of flowing charge, have both positive and negative polarities that are relative to increasing or decreasing electric field strength respectively. Moreover, the charge on the gate G of the transistor 520 controls its transconductance.

Figure 6:
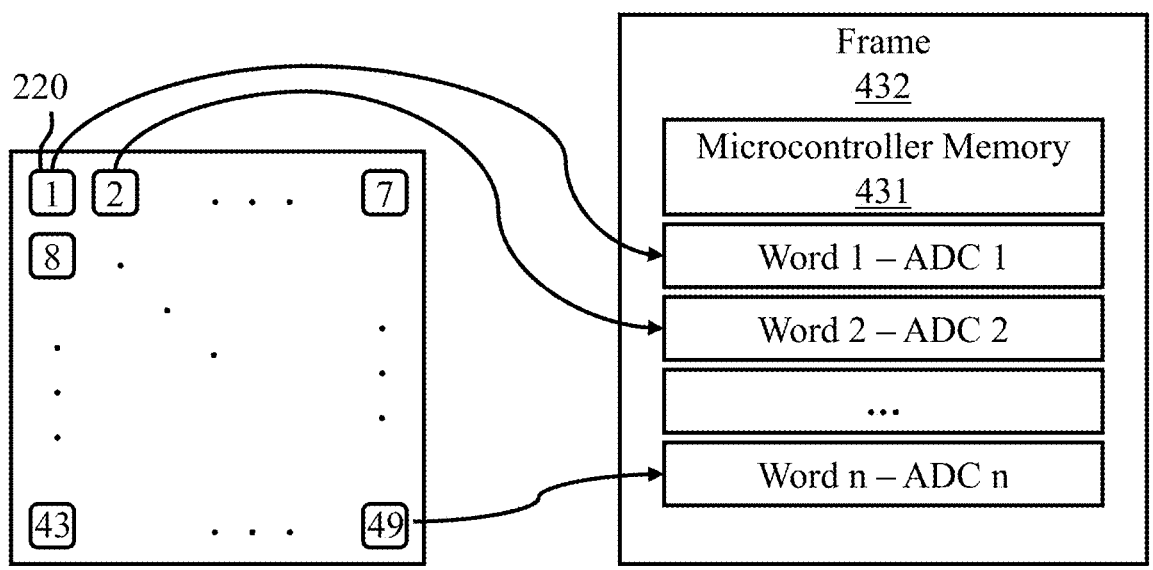
FIG. 6 is a schematic illustration of a sensor array according to an embodiment.

FIG. 6, with reference to FIGS. 1A through 5, further illustrates the image generation process. If it is assumed the sensor array 210 (of FIGS. 2A and 2B) comprises of 7×7 sensors 220, having 49 in total. Assuming an ADC word occupies 1 byte of memory ("Word"), the host computer 330 (of FIG. 3) may allocate 49 bytes of memory in the form of a 2D array. This organization of the memory in this manner can then be used to generate a 7×7 pixel image in which the intensity of each pixel is a function of the ADC value.

The components used to construct the electric field measurement circuit determine its range of sensitivity. These components include the antenna, transistor, resistor and analog to digital converter. Thus, the sensitivity of the measurement device may be judiciously controlled by one or more following: the length of the antenna, operating characteristics of the one or more transistors, and/or the selection of the ADC(s). In general, a longer antenna length provides greater sensitivity, a property useful when measuring weak electric fields, or fields at a distance. For the transistors, the material properties and geometry have an effect too; it is believed the gate insulator thickness (e.g., the gate-oxide thickness), in particular, affects the operational characteristic. As for the selection of ADCs, their fabrication, architecture, and/or resolution as prescribed by number of output bits have an effect too. Generally speaking, increasing the number of bits provides greater sensitivity, but tends to reduce sampling frequency; although, their manufacturing process and architecture also have a significant effect on accuracy, sampling frequency and resolution.

Figure 7:
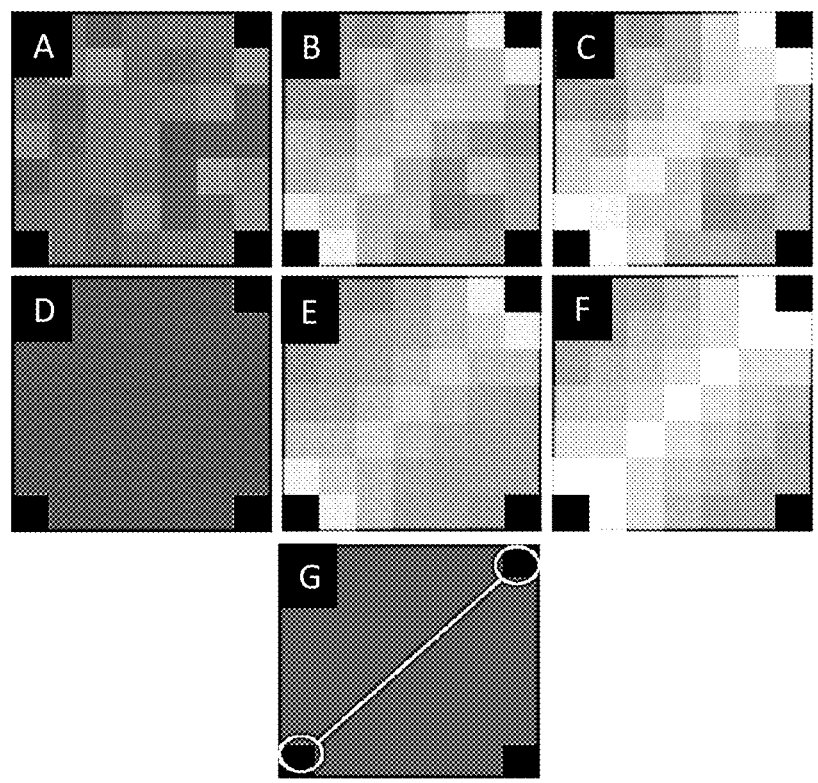
FIG. 7 illustrates examples of a calibration technique performed on images according to an embodiment.

FIG. 7, with reference to FIGS. 1A through 6, illustrates how an image is recreated based on knowledge about location of each antenna in 2D sensor 210, wherein each sensor 220 antenna corresponds to a pixel In general, the more sensor elements, the greater the spatial resolution of the electric field that can be measured. Pixels in the image of the electric field are created from the digital values stored in the electronic memory. For instance, the individual pixels may be assumed to be square of a given intensity value corresponding to electric fields. Gray-scale or color data can be associated with the individual pixels, based on intensity, for example, in which darker shades of gray (or darker colors) are correlate with higher electric field values.

FIG. 7 shows one calibration technique. An uncalibrated visualization of a line source potential presented diagonally across the sensor aperture is shown, and is compared to the idealized field measurement and physical source orientation. Image G shows the orientation of the physical potential source (i.e., a wire wrapped around two posts in opposing corners) relative to the sensor aperture. In an example, the wire source may be set at a fixed spacing of 4 mm (for example) away from the sensor array 500. Images A, B, and C show the uncalibrated measurements of the line source potential oriented diagonally across the sensor aperture, with source field strength along the diagonal at 0 V/µm, 0.0625 V/µm, and 0.125 V/µm, respectively. Images D, E, and F, show the ideal measurement of the electric field 110 that is used to calculate the calibration matrix.

The stationary time varying electric field sensor of the exemplary embodiments is adapted to sense or detect electric fields 110 over large frequency ranges while being compact and power efficient. The stationary time varying electric field sensor may be configured in a 2D spatial array 210 of sensors 220 comprised of FETs (in FIGS. 2A and 2B) to perform high sensitivity, high bandwidth measurement of time varying electric fields 110.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A method for sensing a time varying electric field, the method comprising:
   providing a spatial sensor array including a plurality of circuits, each circuit comprising:
      an antenna configured to receive an RF signal and output an electrical current;
      a transistor connected to the antenna; and
      a resistor connected to the transistor;
   sensing a time varying electric field with the antennas of the circuits;
   modulating current through the transistors of the circuits;
   converting an analog voltage output of each of the circuits to digital form; and
   synchronously capturing the digital output of the circuits in the spatial sensor array as a frame without additional amplification means,
   wherein the spatial sensor array is stationary or in motion during the sensing.

2. The method of claim 1, wherein the transistors of the circuits comprise a junction gate field effect transistor (JFET) or a metal-oxide semiconductor field effect transistor (MOSFET).

3. The method of claim 1, wherein the dynamic range of electric fields sensed ranges from $10^2$ V/m to $10^8$ V/m.

4. The method of claim 1, further comprising: adjusting the sensitivity to electric fields by changing one or more following: the length of the antenna, operating characteristics of the one or more transistors, and/or the selection of an analog digital converter (ADC) also connected to each circuit.

5. The method of claim 1, wherein the frame rate is 50 KHz.

6. A device for sensing a time varying electric field, the device comprising:
   a spatial sensor array comprising a plurality of circuits, each circuit comprising:
      an antenna configured to receive an RF signal and output an electrical current;
      a transistor connected to the antenna;
      a resistor connected to the transistor;
      an analog-to-digital converter (ADC) connected to the resistor; and
   a processor configured to synchronously capture the digital output of the circuits in the spatial sensor array as a frame and process the captured digital output,
   wherein each antenna senses the time varying electric field and modulate current through the transistor it is connected to, and
   wherein the spatial sensor array is to be stationary or in motion during the sensing.

7. The device of claim 6, wherein the transistors of the circuits comprise a junction gate field effect transistor (JFET) or a metal-oxide semiconductor field effect transistor (MOSFET).

8. The device of claim 6, wherein the dynamic range of the device for sensing electric fields ranges from $10^2$ V/m to $10^8$ V/m.

9. The device of claim 6, wherein the sensitivity of the device for sensing electric fields is adjusted by changing one or more following: the length of the antenna, operating characteristics of the one or more transistors, and/or the selection of the ADC(s).

10. The device of claim 6, wherein, in each of the circuits,
   (i) the source of each transistor is connected to a voltage source and the drain of each transistor is connected to the resistor which is also connected to ground; or
   (ii) the source of each transistor is connected to ground and the drain of each transistor is connected to the resistor which is also connected to a voltage source.

11. The device of claim 6, wherein the spatial array comprises:
   (i) a plurality of antennas arranged in a one dimensional (1D) spatial array, each of the antennas connected to a single transistor; or
   (ii) a plurality of antennas arranged in a two dimensional (2D) spatial array, with each of the antennas connected to a single transistor.

12. The device of claim 11, wherein each antenna forms an individual pixel of the device.

13. The device of claim 6, wherein the frame rate is 50 KHz.

14. The device of claim 6, wherein each circuit comprises: a single resistor, a single power connection, and a single ground connection.

15. The device of claim 6, wherein the processor is configured to synchronously capture the digital output of the circuits in the spatial sensor array as a frame without additional amplification means.

16. A method of forming the device of claim 6, comprising:
   patterning the circuits on a substrate using photolithography.

17. A system for sensing a time varying electric field, the system comprising:
   a spatial sensor array comprising a plurality of circuits, each circuit comprising:
      a field effect transistor (FET) connected to the antenna;
      a resistor connected to the FET;
      an analog-to-digital converter (ADC) connected to the resistor; and
      an antenna connected to the FET, wherein the antenna is to sense the time varying electric field and modulate current through the FET, wherein the spatial sensor array is to be stationary or in motion during the sensing; and
   a computer processor configured to synchronously capture the digital output of the circuits in the spatial sensor array as a frame without additional amplification means and process the captured digital output.

18. The system of claim 17, wherein the dynamic range of the system for sensing electric fields ranges from $10^2$ V/m to $10^8$ V/m.

19. The system of claim 17, wherein the sensitivity of the system for sensing electric fields is adjusted by changing one or more following: the length of the antenna, operating characteristics of the one or more FETs, and/or the selection of the ADCs.

20. The system of claim 17, further comprising a memory which stores digital output of the ADCs for a given time sequence.

* * * * *